United States Patent
Jeong et al.

(10) Patent No.: US 8,428,191 B2
(45) Date of Patent: Apr. 23, 2013

(54) DC OFFSET SUPPRESSION CIRCUIT FOR A COMPLEX FILTER

(75) Inventors: Seong-Heon Jeong, Seongnam (KR); Myung-Woon Hwang, Seongnam (KR)

(73) Assignee: FCI Inc., Gyeonggi-Do (KR)

( * ) Notice: Subject to any disclaimer, the term of this patent is extended or adjusted under 35 U.S.C. 154(b) by 381 days.

(21) Appl. No.: 12/835,482

(22) Filed: Jul. 13, 2010

(65) Prior Publication Data

US 2011/0103518 A1     May 5, 2011

(30) Foreign Application Priority Data

Oct. 30, 2009   (KR) ................. 10-2009-01104233

(51) Int. Cl.
*H04L 25/06*     (2006.01)
(52) U.S. Cl.
USPC ........................................ 375/316
(58) Field of Classification Search ............... 375/316, 375/298
See application file for complete search history.

(56) References Cited

U.S. PATENT DOCUMENTS

| | | | | |
|---|---|---|---|---|
| 6,335,656 B1 * | 1/2002 | Goldfarb et al. | ............. | 327/559 |
| 6,803,867 B1 * | 10/2004 | Juang | ............. | 341/118 |
| 6,907,235 B2 * | 6/2005 | Lisenbee | ............. | 455/296 |
| 7,155,185 B2 * | 12/2006 | Pipilos | ............. | 455/232.1 |
| 2005/0043001 A9 * | 2/2005 | Toncich et al. | ............. | 455/323 |
| 2005/0129141 A1 * | 6/2005 | Lee | ............. | 375/298 |
| 2006/0244521 A1 * | 11/2006 | Yoshida et al. | ............. | 330/9 |
| 2007/0237264 A1 * | 10/2007 | Huang et al. | ............. | 375/332 |

* cited by examiner

*Primary Examiner* — Jaison Joseph

(57) ABSTRACT

The present invention relates to a direct current (DC) offset suppression circuit to suppress DC offsets occurring when a communication circuit where a complex filter is adopted performs self-mixing. The DC offset is suppressed by a DC feedback circuit adopted by a filter which is substituted for a complex filter in the communication circuit. But, the DC offset cannot be suppressed when a complex filter is used in the communication circuit. It is because phase changes of the complex filter cause output signal fed back to the input of the complex filter to generate phase differences. The present invention includes a phase compensation unit and a DC feedback unit. The phase compensation unit compensates a change in frequency between input and output of the complex filter for phase compensation. The DC feedback unit inverses and feeds back the compensated phase to an input of the complex filter.

4 Claims, 8 Drawing Sheets

DC OFFSET SUPPRESSION CIRCUIT FOR A COMPLEX FILTER

BACKGROUND OF THE INVENTION

1. Claim of Priority

This application claims priority to Korean Patent Application No. 10-2009-0104233 filed on Oct. 30, 2009.

2. Field of the Invention

The present invention relates to a DC offset suppression circuit for a complex filter used in the Low-IF communication circuit, and more particularly, to a DC offset suppression circuit which utilizes a phase compensation circuit with resistance ratios. The phase compensation circuit suppresses the DC offset of the complex band-pass filter by feeding back the compensated phase to an input of the complex filter through the DC feedback unit.

3. Description of Prior Art

Under ordinary circumstances of wireless communication systems, signal received by an antenna is amplified by a low noise amplifier (LNA) and mixed with carrier signals generated by a frequency generator in a mixer. Then, the signals are input to a filter to detect reception signals. At this time, the signals received by the antenna and the frequency of the carrier signals are equalized in the mixer. There are two ways to transmit the signals. One way is called a direct conversion (DC) where the signals are transmitted to a DC frequency, and the other way is called a low-intermediate-frequency (low-IF) where the signals are transmitted close to an approximate DC intermediate frequency.

However, carrier signals generated by the frequency generator in the mixer may perform self-mixing when the antennae do not receive signals, or in other words, when the LNA does not output any signals.

If the mixer performs self-mixing as mentioned above, a filter, a programmable gain amplifier (PGA), or variable gain amplifier (VGA) at the posterior end of the mixer will generate self-gain, which causes to amplify DC components. The amplified DC components may cause damage in transistors inside the filter or PGA. In order to solve this problem, a DC feedback circuit is usually utilized to suppress the amplified DC offset due to the self-gain of the filter or PGA.

Referring to FIG. 1 and FIG. 2, FIG. 1 illustrates a block diagram of a receiver of conventional communication systems, and FIG. 2 illustrates a circuit diagram of a filter of a conventional DC offset suppression circuit.

As FIG. 1 and FIG. 2 show, a radio frequency (RF) receiver comprises a low noise amplifier (LNA) 1, a mixer 2, a filter unit 3, and a programmable gain amplifier (PGA) 4. The LNA 1 receives RF signals from antennae. The mixer 2 mixes output signals from the LNA 1 and intermediate frequency signals. The filter unit 3 filters output signals from the mixer 2. The PGA 4 amplifies output signals from the filter unit 3, which comprises a filter $A_0$ and a DC feedback unit $B_0$. The DC feedback unit $B_0$ is used to feed back the DC to suppress the DC offset. An intermediate frequency generating unit 5, comprising a voltage-controlled oscillator (VCO) and a phase lock loop (PLL), generates intermediate frequency signals. The mixer 2 is used to mix the intermediate frequency signals generated from the intermediate frequency occurring unit 5 and the output signals from the LNA 1.

As mentioned above, the DC offset suppression method adopted by the direct-conversion communications adopts is that, the entire high-pass filter (HPF) $A_0$ and the DC feedback unit $B_0$ form a single feedback loop to suppress the DC offset.

However, under circumstances where a complex filter is used, a phase error will occur when signals pass through the above-mentioned DC feedback unit to suppress the DC offset.

Referring to FIG. 3, FIG. 3 is a circuit diagram illustrating a traditional complex filter. As FIG. 3 shows, the traditional complex filter comprises a first filter unit 31, a second filter unit 32, and a frequency-changing unit 33. The first filter unit 31 filters a first input Viinm and a second input Viinp output by a mixing circuit and generates a first output Vioutp and a second output Vioutm. The second filter unit 32 filters a third input Vqinm and a fourth input Vqinp output by the mixing circuit and generates a third output Vqoutp and a fourth output Vqoutm. The frequency-changing unit 33 feeds back the outputs from the first filter unit 31 to an input of the second filter unit 32 and then feeds back the outputs from the second filter unit 32 to an input of the first filter unit 31. That is, the first filter unit 31 filters I signals; the second filter unit 32 filters Q signals; the frequency-changing unit 33 feeds back the I signals to an input of the Q signals and then feeds back the Q signals to an input of the I signals by means of resistors. In this way, the frequencies are altered.

Therein, there is a 180-degree phase difference between the first input Viinm and the second input Viinp. The phase of the third input Vqinm is 90 degrees relative to the phase of the first input Viinm, and the phase of the fourth input Vqinp is 90 degrees relative to the phase of the second input Viinp. Similarly, there is a 180-degree phase difference between the first output Vioutp and the second output Vioutm. The phase of the third output Vqoutp is 90 degrees relative to the phase of the first output Vioutp, and the phase of the fourth output Vqoutm is 90 degrees relative to the phase of the second output Vioutm.

As shown in FIG. 4, the outputs are fed back to the inputs alternatively via the frequency-changing unit 33 of the complex filter and the frequencies are altered by adjusting the resistance of the frequency-changing unit 33.

Therefore, when self-mixing occurs in the complex filter where only a traditional DC offset suppression circuit, that is, an ordinary DC feedback unit, is adopted, phase will vary due to the characteristics of the complex filter.

Referring to FIGS. 5a and 5b, FIG. 5a is an equivalent-circuit diagram showing an ordinary low pass filter, and FIG. 5b is an equivalent-circuit diagram showing an ordinary complex filter. A formula for the low pass filter shown in FIG. 5a is as follows:

$$\frac{Vout}{Vin} = \frac{R2/R1}{1+sR2C2} = \frac{R2/R1}{1+j\frac{w}{w_0}}\left(w_0 = \frac{1}{R2C2}\right) \quad \text{Formula 1}$$

A formula for the phase of the low pass filter is as follows:

$$\tan\phi = \frac{w}{w_0} \text{(phase)} \quad \text{Formula 2}$$

A formula for the complex filter shown in FIG. 5b is as follows:

$$\frac{Vout}{Vin} = \frac{R2/R1}{1+sR2C2-jR2/Rx} \quad \text{Formula 3}$$

-continued $$= \frac{R2/R1}{1+j\left(\frac{w}{w_0}-\frac{R2}{Rx}\right)}\left(w_0 = \frac{1}{R2C2}\right)$$

A formula for the phase of the complex filter is as follows:

$$\tan\phi = \frac{w}{w_0} - \frac{R2}{Rx} \text{(phase)} \qquad \text{Formula 4}$$

Therefore, the output Vout occurs phase variation of R2/Rx.

SUMMARY OF THE INVENTION

An object of the present invention is to provide a DC offset suppression circuit applied to a communication circuit which adopts a complex filter to solve the above-mentioned problems. The DC offset suppression circuit is used to suppress a DC offset occurring in self-mixing of the mixer. The output of the complex filter passes through a phase compensation circuit, and the phase of the output is compensated. Next, the output of the complex filter passes through a DC feedback unit and is fed back to an input of the complex filter. In this way, the DC offset can be suppressed.

Another object of the present invention is to simplify phase compensation by using variable resistors and switches to single I and Q output signals out. With the single I and Q output signals, the phase compensation circuit can generate phase compensation signals to suppress the DC offset.

In one aspect of the present invention, the present invention provides a DC offset suppression circuit for suppressing a DC offset occurring in self-mixing of a mixer in a communication circuit where a complex filter is adopted. The DC offset suppression circuit comprises a phase compensation unit compensating outputs generated from the complex filter, which receives inputs, for altered frequencies to realize phase compensation; and a DC feedback unit reversing and feeding back phase of outputs of the complex filter to an input of the complex filter, wherein phase of the outputs of the complex filter is compensated in the phase compensation unit.

In another aspect of the present invention, the phase compensation unit comprises phase compensating variable resistors for receiving first and second outputs of I signals and third and fourth outputs of Q signals of the complex filter and compensating the first and second outputs and the third and fourth outputs for altered phase; and a switch unit for selecting the first output or the third output and outputting a first phase compensation signal, and selecting the second output or the fourth output and outputting a second phase compensation signal from the first and second outputs and the third and fourth outputs of which phase is compensated.

The present invention can successfully suppress the DC offset by compensating phase of signals of which frequencies are altered in the complex filter and then by providing feedback to the complex filter via the DC feedback unit. Besides, the present invention selects a combination of resistance ratios and I and Q output signals for phase compensation in order to facilitate configuring effects of phase compensation.

These and other objectives of the present invention will become apparent to those of ordinary skill in the art after reading the following detailed description of the preferred embodiment that is illustrated in the various figures and drawings.

DETAILED DESCRIPTION OF THE PREFERRED EMBODIMENTS

Figure 1:
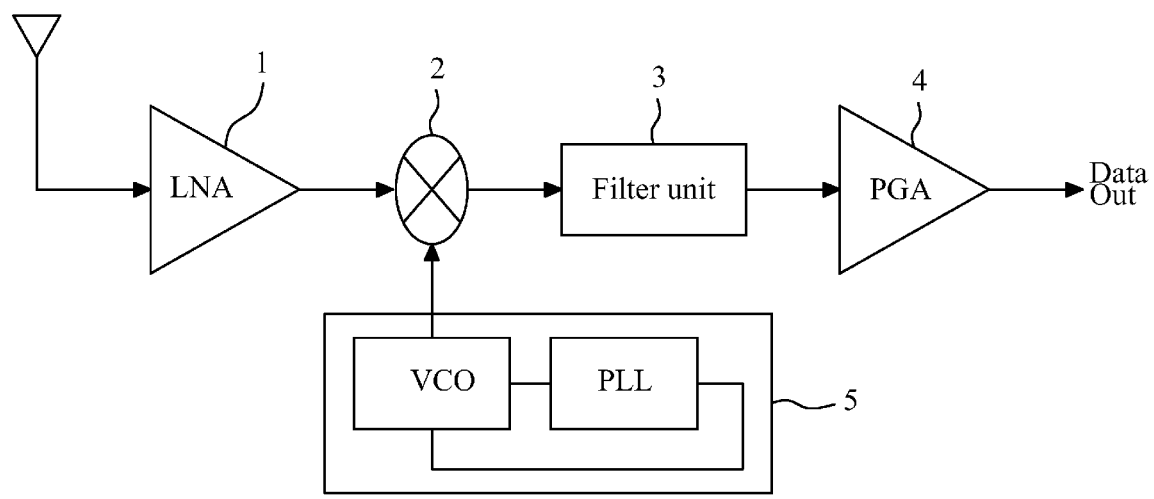
FIG. 1 illustrates a block diagram of a receiver of ordinary communication systems.
Figure 2:
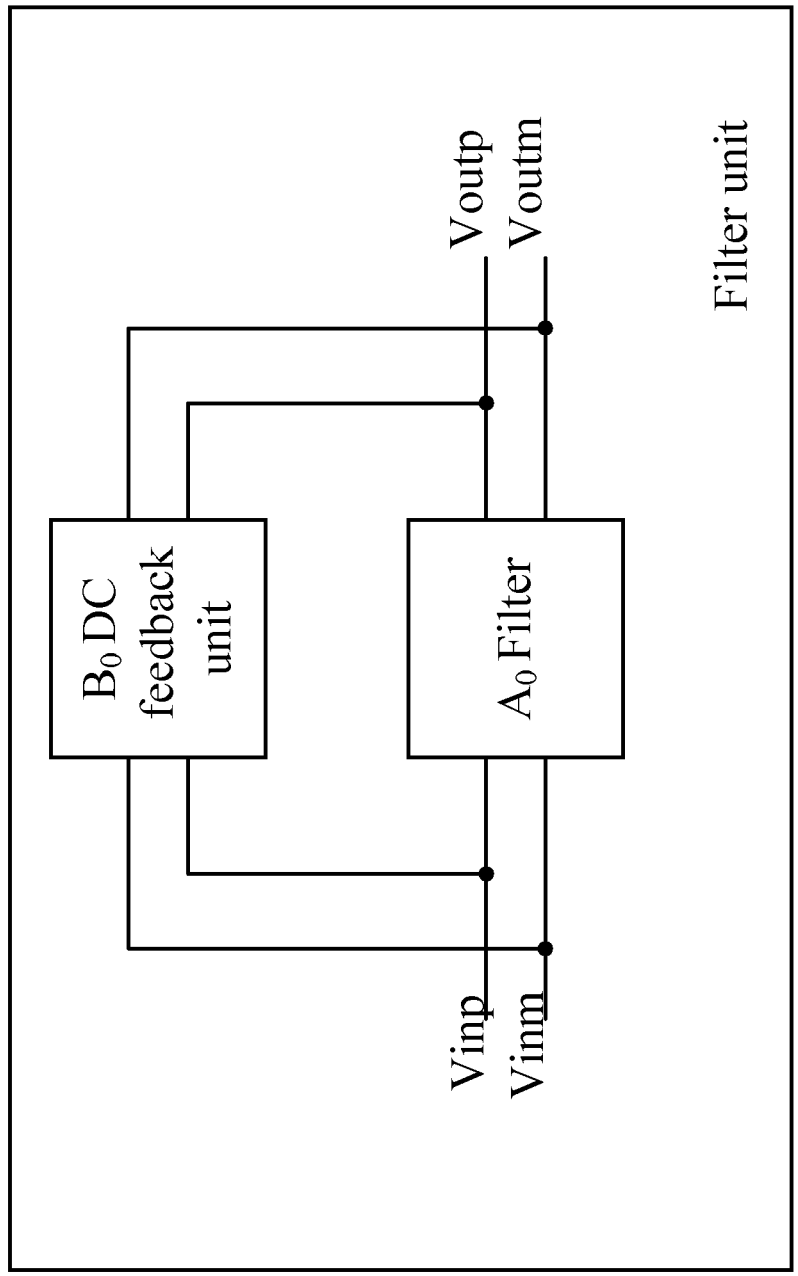
FIG. 2 illustrates a circuit diagram of a filter of an ordinary DC offset suppression circuit
Figure 3:
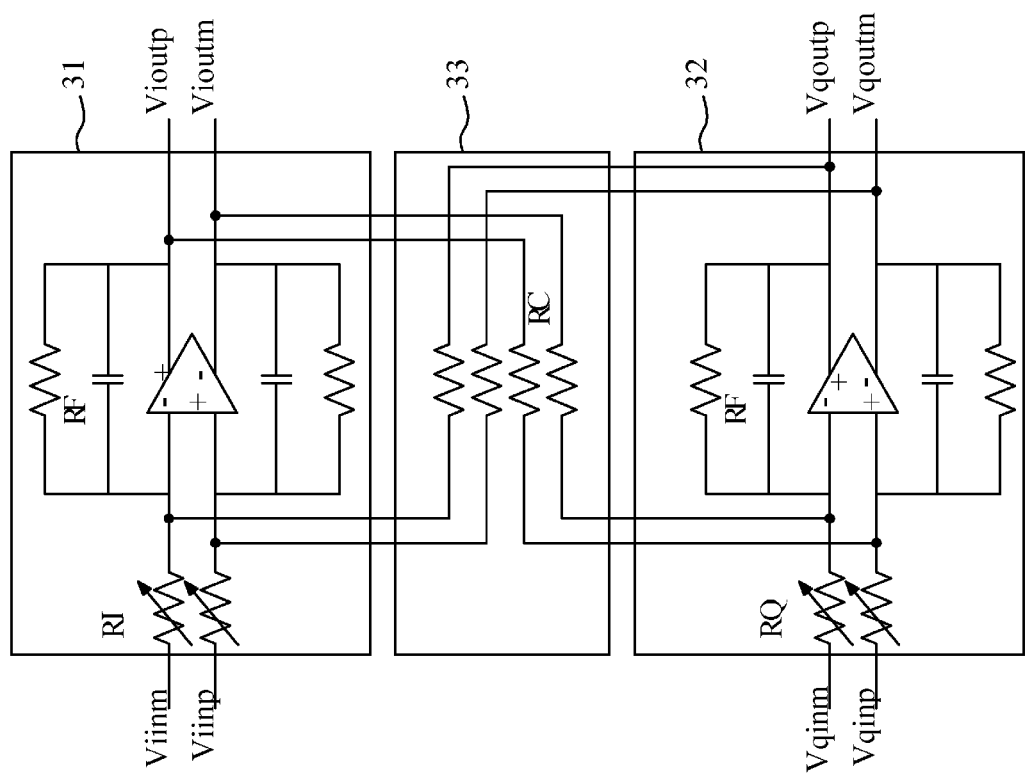
FIG. 3 illustrates a traditional complex filter.
Figure 4:
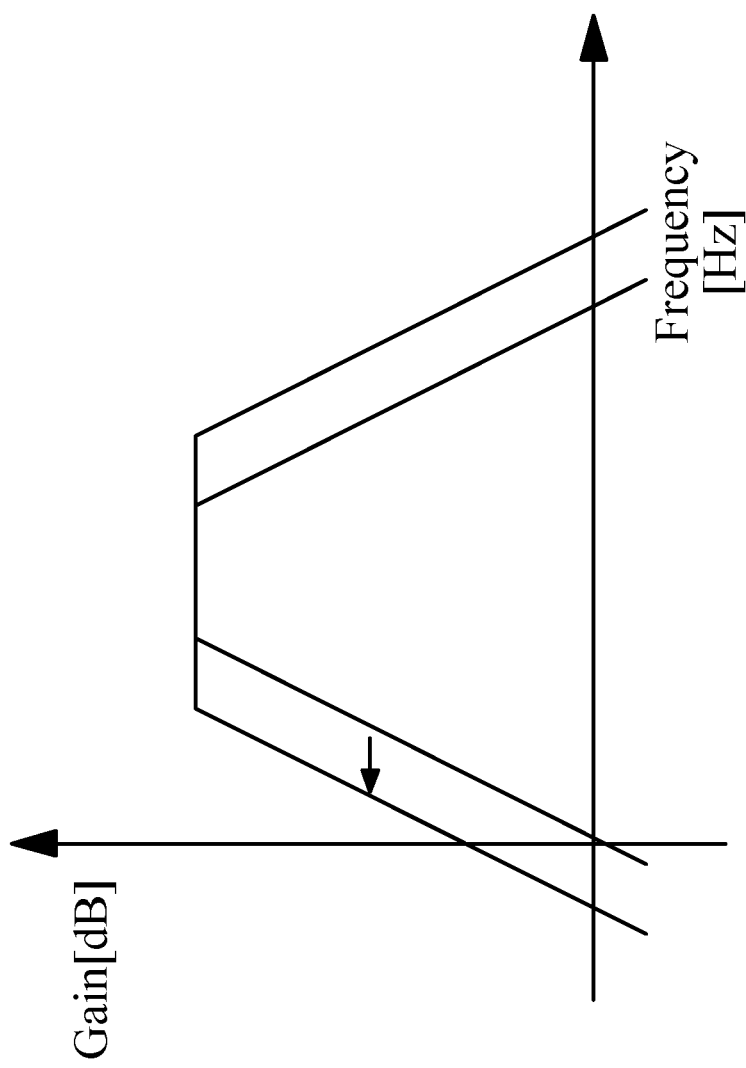
FIG. 4 shows frequency changing of the complex filter.
Figure 5A:
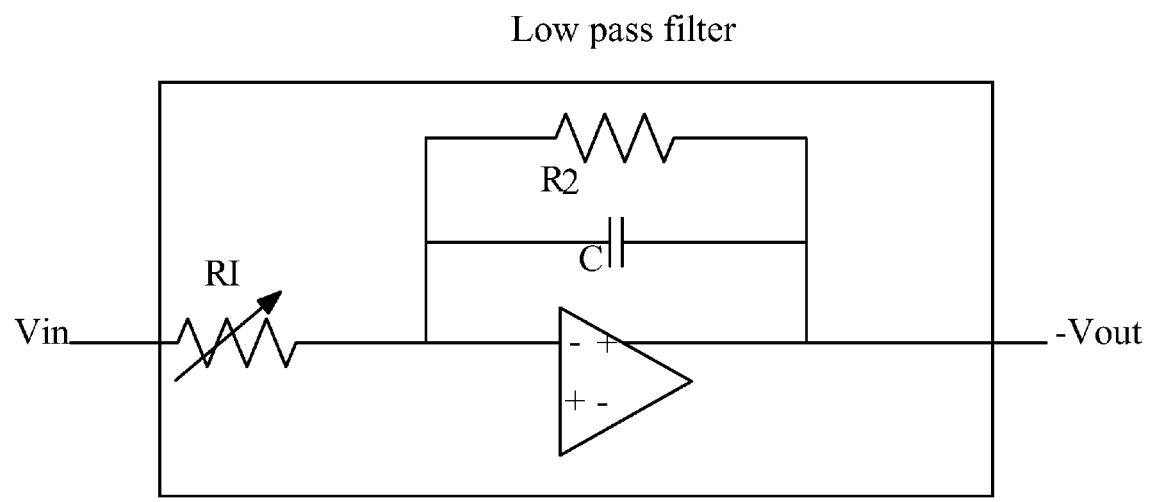
FIG. 5a is an equivalent-circuit diagram showing a conventional low pass filter.
Figure 5B:
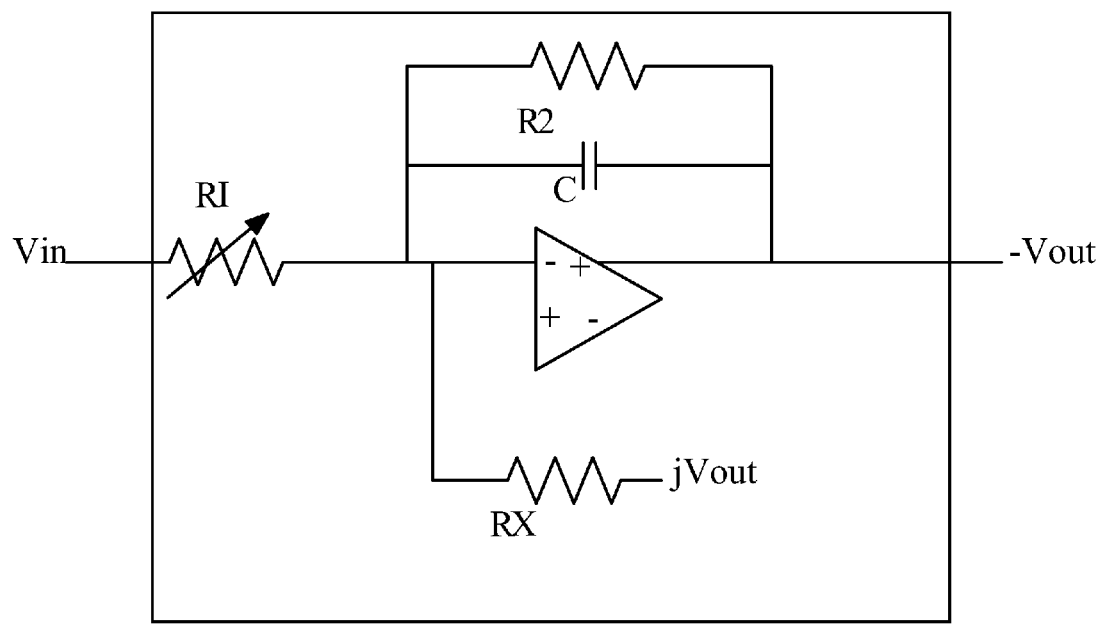
FIG. 5b is an equivalent-circuit diagram showing a conventional complex filter.
Figure 6:
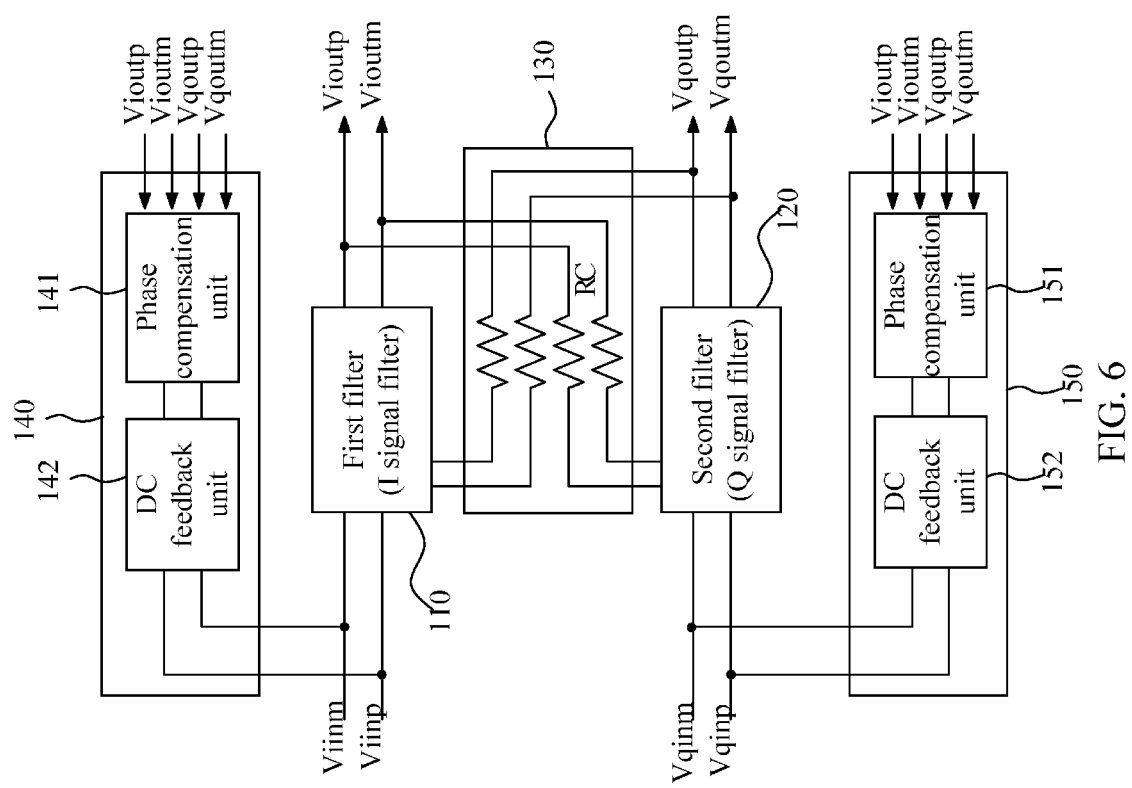
FIG. 6 illustrates a DC offset suppression circuit diagram of the present invention for a complex filter.
Figure 7:
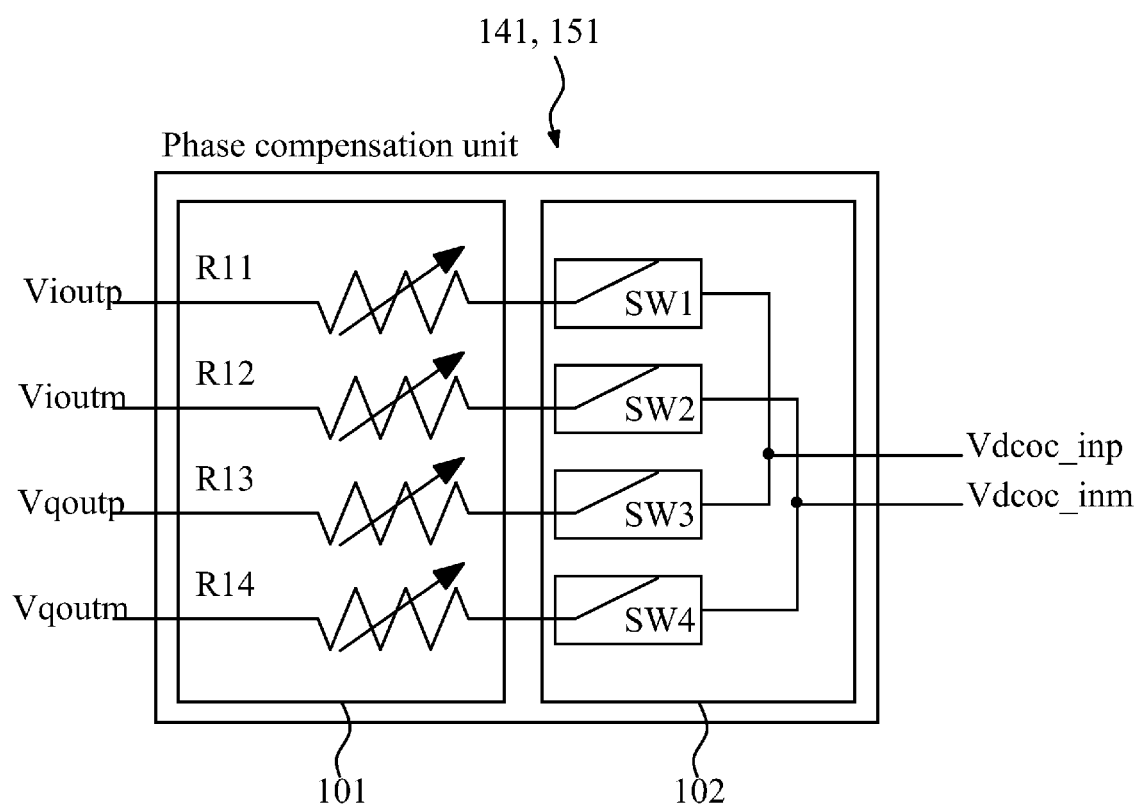
FIG. 7 illustrates a composition diagram of the phase compensation unit in FIG. 6.

Referring to FIG. 6 and FIG. 7, FIG. 6 illustrates a DC offset suppression circuit diagram of the present invention for a complex filter, and FIG. 7 illustrates a composition diagram of the phase compensation unit in FIG. 6. As shown in FIG. 6 and FIG. 7, the DC offset suppression circuit is used to pass the outputs of the complex filter through the DC feedback unit to provide feedback to suppress the DC offset occurring in self-mixing of the mixer. The above-mentioned complex filter comprises a first filter unit 110, a second filter unit 120, and a frequency-changing unit 130. The mixing circuit outputs I signals to act as a first input Viinm and a second input Viinp of the first filter unit 110. The first input Viinm and the second input Viinp are input to the first filter unit 110 to undergo filtering. Afterward, the first filter unit 110 generates a first output Vioutp and a second output Vioutm. The mixing circuit outputs Q signals to act as a third input Vqinm and a fourth input Vqinp of the second filter unit 120. The third input Vqinm and the fourth input Vqinp are input to the second filter unit 120 to undergo filtering. Afterward, the second filter unit 120 generates a third output Vqoutp and a fourth output Vqoutm. The frequency-changing unit 130 feeds back the outputs from the first filter unit 110 to an input of the second filter unit 120 and the outputs from the second filter unit 120 to an input of the first filter unit 110, respectively, via frequency-changing resistors (Rc).

The first and second offset suppression circuits 140 and 150 comprise phase compensation units 141 and 150, respectively, and DC feedback units 142 and 152, respectively. Relative to the first output Vioutp, the second output Vioutm, the third output Vqoutp, and the fourth output Vqoutm, which have underwent filtering by the first and second filters 110 and 120, the first input Viinm, the second input Viinp, the third input Vqinm, and the fourth input Vqinp have a phase difference. Because of this, the phase compensation units 141 and 151 are used to compensate the phase of the output signals from the first and second filters 110 and 120. Afterwards, the signals of which phase is compensated in the phase compensation units 141 and 151 are reversed and fed back to the DC feedback units 142 and 152, respectively. The DC feedback units 142 and 152 are electrically connected to inputs of the first and the second filters 110 and 120.

The phase compensation units 141 and 151 comprise a phase compensating resistor unit 101 and a switch unit 102. In the phase compensating resistor unit 10, the frequencies of the first output Vioutp and the second output Vioutm from the first filter 110 and the frequencies of the third output Vqoutp and the fourth output Vqoutm from the second filter 120 undergo recovery, respectively, by passing through variable resistors R11-R14. The frequencies are altered in the frequency-changing unit 130 in the complex filter. The switch unit 102 comprises a first and a third switch SW1 and SW3 and a second and a fourth switch SW2 and SW4. The first and the third switches SW1 and SW3 single out the first output Vioutp or the third output Vqoutp, which is compensated for phase after passing through the phase compensating resistor unit 101, and then output a first phase compensation signal Vdcoc_inp. The second and the fourth switches SW2 and SW4 single out the second output Vioutm or the fourth output Vqoutm, which is compensated for phase after passing through the phase compensating resistor unit 101, and then output a second phase compensation signal Vdcoc_inm.

As mentioned above, if the communication circuit merely adopts a complex filter comprising the first filter 110, the second filter 120, and the frequency-changing unit 130, it cannot obtain the effect of DC offset suppression due to a phase difference generated by the current DC feedback circuit.

Therefore, the phase compensation units 141 and 151 of the present invention compensate and input the altered phase difference to the DC feedback units 142 and 152. Accordingly, it will ensure that the complex filter suppresses the DC offset.

The phase compensation units 141 and 151, comprising the phase compensating resistor unit 101 and the switch unit 102, can generate the first phase compensation signal Vdcoc_inp and the second phase compensation signal Vdcoc_inm according to a resistance ratio of the phase compensating resistor unit 101 and a selection of the switch unit 102. The resistance ratio refers to a ratio of the altered electric resistance of the frequency-changing unit 130 of the complex filter to the phase compensating electric resistance of the phase compensation units 141 and 151. The phase compensation units 141 and 151 utilize the resistance ratio to generate the first phase compensation signal Vdcoc_inp and the second phase compensation signal Vdcoc_inm, which are used to compensate for the altered phase difference, after the switch unit 102 selects the first, second, third, and fourth outputs Vioutp, Vioutm, Vqoutp, and Vqoutm.

Accordingly, the phase compensation units 141 and 151 can generate the first phase compensation signal Vdcoc_inp and the second phase compensation signal Vdcoc_inm by means of resistance ratios and by means of combinations of the four signals with diverse phase differences, that is, Vioutp (0 degree), Vioutm (180 degrees), Vqoutp (90 degrees), and Vqoutm (270 degrees). In this way, it has become very easy for selections in phase compensations.

As mentioned above, the complex filter is adopted in the present invention. The DC feedback unit reverses and feeds back the phase-compensated first and second phase compensation signals Vdcoc_inp and Vdcoc_inm to the input of the complex filter. In this way, a problem that phase differences occur when the mixer only adopts a single DC feedback unit in self-mixing can be resolved. So, to successfully suppress the DC offset of the complex filter can be realized.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A DC offset suppression circuit for suppressing a DC offset occurring in self-mixing of a mixer in a communication circuit where a complex filter is adopted; the DC offset suppression circuit comprising:
   a phase compensation unit compensating outputs generated from the complex filter, which receives inputs, for altered frequencies to realize phase compensation; and
   a DC feedback unit reversing and feeding back phase of outputs of the complex filter to an input of the complex filter, wherein phase of the outputs of the complex filter is compensated in the phase compensation unit.

2. The DC offset suppression circuit of claim 1 wherein the phase compensation unit comprising:
   phase compensating variable resistors for receiving first and second outputs of I signals and third and fourth outputs of Q signals of the complex filter and compensating the first and second outputs and the third and fourth outputs for altered phase; and
   a switch unit for selecting the first output or the third output and outputting a first phase compensation signal, and selecting the second output or the fourth output and outputting a second phase compensation signal from the first and second outputs and the third and fourth outputs of which phase is compensated.

3. A DC offset suppression circuit of a complex filter transiting outputs of the complex filter to the DC feedback unit to feed back to suppress a DC offset occurring in self-mixing of a mixer; the complex filter comprising:
   a first filter unit for generating a first output and a second output after filtering a first input and a second input outputted by a mixing circuit;
   a second filter unit for generating a third output and a fourth output after filtering a third input Vqinm and a fourth input Vqinp output by a mixing circuit;
   a frequency-changing unit for feeding back the outputs from the first filter unit to an input of the second filter unit and the outputs from the second filter unit to an input of the first filter unit, respectively, via frequency-changing resistors; the DC offset suppression circuit comprising a first suppression circuit and a second offset suppression circuit, each offset suppression circuit comprising:
      a phase compensation unit for compensating output signals input to the first and the second filters for phase of altered frequencies; and
      DC feedback unit for reversing phase of compensated signals in the phase compensation unit and feeding back the compensated signals to inputs of the first and second filter units.

4. The DC offset suppression circuit of the complex filter of claim 3 wherein the phase compensation unit comprising:
   a phase compensating resistor unit for recovering altered frequencies in the frequency-changing unit of the complex filter via variable resistors after the first and second outputs of I signals from the first filter unit and the third and fourth outputs of Q signals from the first filter unit are input, respectively; and
   a switch unit comprising first, second, third, and fourth switches wherein the first and third switches select the first or third output, which passes through the phase compensating resistor unit and receives phase compensation, and outputs a first phase compensation signal, and the second and fourth switches select the second or fourth output and outputs a second phase compensation signal.

* * * * *